(12) United States Patent
Lyden et al.

(10) Patent No.: US 7,012,471 B2
(45) Date of Patent: Mar. 14, 2006

(54) GAIN COMPENSATED FRACTIONAL-N PHASE LOCK LOOP SYSTEM AND METHOD

(75) Inventors: Colin Lyden, Cork (IE); Michael F. Keaveney, Lisnagry (IE); Patrick Walsh, Limerick (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/872,626

(22) Filed: Jun. 21, 2004

(65) Prior Publication Data

US 2005/0024152 A1 Feb. 3, 2005

Related U.S. Application Data

(60) Provisional application No. 60/483,411, filed on Jun. 27, 2003, provisional application No. 60/544,439, filed on Feb. 14, 2004.

(51) Int. Cl.
*H03L 7/00* (2006.01)

(52) U.S. Cl. .......................... 331/16; 331/1 A; 331/34; 327/105; 327/156; 332/127

(58) Field of Classification Search ................. 331/16, 331/17, 1 A, 34; 332/127; 327/156, 105
See application file for complete search history.

(56) References Cited

U.S. PATENT DOCUMENTS 4,156,855 A 5/1979 Crowley ..................... 331/1 A
5,834,987 A * 11/1998 Dent .......................... 332/127
6,111,470 A 8/2000 Dufour ......................... 331/17

OTHER PUBLICATIONS

Rhee, W., "Design of High-Performance CMOS Charge Pums in Phase-Locked Loops", IEEE International Symposium on Circuits and Systems (ISCAS), 1999, vol. 2, pp. 545-548.
"An Analysis and Performance Evaluation of a Passive Filter Design Technique for Charge Pump PLL's", National Semiconductor Application Note 1001, Jul. 2001, pp. 1-8.
Byrd, et al."A Fast Locking Scheme for PLL Frequency Synthesizers", National Semiconductor Application Note 1000, Jul. 1995, pp. 1-6.
Curtin et al., "Phase Locked Loops for High-Frequency Receivers and Transmitters-Part 3", Analog Dialogue 33-7 (1999), pp. 1-5.
Rhee et al., "A1.1-Ghz CMOS Fractional-N Frequency Synthesizer with a 3-b Third-Order Delta Sigma Modulator"; IEEE Journal of Solid-State Circutis, vol. 35, No. 10, Oct. 2000, pp 1453-1460.

(Continued)

*Primary Examiner*—Arnold Kinkead
(74) *Attorney, Agent, or Firm*—Iandiorio & Teska

(57) ABSTRACT

A gain compensation technique for a fractional-N phase lock loop includes locking a reference signal with the N divider feedback signal in a phase lock loop including a phase detector, charge pump, loop filter and voltage control oscillator with an N divider in its feedback loop; driving the N divider with a sigma delta modulator including at least one integrator to obtain a predetermined fractional-N feedback signal; and commanding a scaling in phase lock loop gain by a predetermined factor and synchronously inversely scaling by that factor the contents of at least one of the integrators.

13 Claims, 5 Drawing Sheets

OTHER PUBLICATIONS

Greshishchev et al., "SiGe Clock and Data Recovery IC with Linear-Type PLL for 10-Gb/s SONET Application"; IEEE Journal of Solid-State Circuits, vol. 35, No. 9, Sep. 2000, pp 1353-1359.

Bastos et al., "A 12-Bit Intrinsic Accuracy High-Speed CMOS DAC"; IEEE Journal of Solid-State Circuits, Vo. 33, No. 12, Dec. 1998, pp. 1959-1969.

* cited by examiner

GAIN COMPENSATED FRACTIONAL-N PHASE LOCK LOOP SYSTEM AND METHOD

RELATED APPLICATIONS

This application claims the benefit of U.S. Provisional Application No. 60/483,411 filed Jun. 27, 2003, and U.S. Provisional Application No. 60/544,439 filed Feb. 14, 2004 incorporated by reference herein.

FIELD OF THE INVENTION

This invention relates to a gain compensated fractional-N phase lock loop system and method and more particularly to such a system and method in which a relatively fast digital sigma delta converter quickly compensates for gain changes in a relatively slow analog phase lock loop.

BACKGROUND OF THE INVENTION

In fractional-N phase lock loops (PLL's) it is typically required to decrease the charge pump current to narrow the bandwidth. When the charge pump current is reduced in magnitude, it can take time for the PLL to adjust to the new dynamics. If the change is sudden then there will inevitably be some ringing and overshoot in the response that will be slow to die out in narrow-band mode. In the transition from wideband to narrow band modes, the charge pump current is often reduced in steps. The ΣΔ modulator in a fractional-N PLL produces a noise shaped sequence of output codes around the desired fractional value. This translates to sequences of current pulse widths out of the charge pump. If the charge pump changes and the ΣΔ modulator does not know about it, then there will be a disturbance in the PLL that will be slow to settle out, particularly when the bandwidth is reduced.

BRIEF SUMMARY OF THE INVENTION

It is therefore an object of this invention to provide an improved gain compensated fractional-N phase lock loop system and method.

It is a further object of this invention to provide such a gain compensated fractional-N phase lock loop system and method which reduces the disturbance in output phase due to charge pump current changes.

It is a further object of this invention to provide such a gain compensated fractional-N phase lock loop system and method in which the width of the charge pump current pulses is scaled up to compensate for the scaling down of the charge pump current amplitude so the overall charge in the loop stays the same.

It is a further object of this invention to provide such a gain compensated fractional-N phase lock loop system and method in which the scaling up is done by the fast acting digital ΣΔ modulator in a few clock cycles so the slower acting analog PLL sees little overall change.

The invention results from the realization that a gain compensated fractional-N phase lock loop system in which the disturbance in output phase due to gain changes is minimized and compensated for very quickly by a fast acting loop containing a ΣΔ converter, before the slower acting PLL has to react, can be achieved by scaling up/down the width of the charge pump pulses to just offset the scaling down/up of the charge pump pulse amplitude so that the overall charge in the PLL stays essentially the same.

The subject invention, however, in other embodiments, need not achieve all these objectives and the claims hereof should not be limited to structures or methods capable of achieving these objectives.

This invention features a gain compensated fractional-N phase lock loop system including a phase lock loop having a phase detector, charge pump, loop filter and voltage control oscillator with an N divider in its feedback loop for locking a reference signal with the N divider feedback signal. There is a sigma delta (ΣΔ) modulator including at least one integrator for driving the N divider to obtain a predetermined fractional-N feedback signal. A control circuit commands a scaling in phase lock loop gain by a predetermined factor and synchronously inversely scales by the same factor the contents of at least one of the integrators.

In a preferred embodiment the control current may command a scaling in charge pump current pulse amplitude by a predetermined factor and synchronously inversely scaling by that factor the contents of at least one of the integrators to scale the width of the charge pump pulses to maintain the expected charge from the charge pump. The at least one integrator may include a scaling circuit for scaling the contents of its associated integrator. The scaling circuit may include a multiplier circuit for modifying the integrator contents and a switching circuit for selecting the contents of the integrator or the scaled contents of the integrator to effect the scaling factor. The control circuit may include a counter responsive to the reference signal and the commanded charge pump current pump amplitude scaling for enabling the switching circuit to select the scaled contents of the integrator one cycle before the scaling of the charge pump current pulse amplitude. There may be a plurality of successive integrators and at least one beyond the first integrator may have a scaling circuit for scaling the contents of its associated integrator. The scaling factor may be greater than one or less than one.

This invention also features a gain compensation method for a fractional-N phase lock loop including locking a reference signal with the N divider feedback signal in a phase lock loop including a phase detector, charge pump, loop filter and voltage control oscillator with an N divider in its feedback loop and driving the N divider with a sigma delta modulator including at least one integrator to obtain a predetermined fractional-N feedback signal. A scaling in phase lock loop gain by a predetermined factor is commanded and the contents of at least one of the integrators is synchronously inversely scaled by that factor.

This invention also features a gain compensation method for a fractional-N phase lock loop including locking a reference signal with the N divider feedback signal in a phase lock loop including a phase detector, charge pump, loop filter and voltage control oscillator with an N divider in its feedback loop and driving the N divider with a sigma delta modulator including at least one integrator to obtain a predetermined fractional-N feedback signal. A scaling in charge pump current pulse amplitude by a predetermined factor is commanded and the contents of at least one of the integrators is synchronously inversely scaled by that factor to scale the width of the charge pump pulses to maintain the expected charge from the charge pump.

BRIEF DESCRIPTION OF THE DRAWINGS

Other objects, features and advantages will occur to those skilled in the art from the following description of a preferred embodiment and the accompanying drawings, in which.

DISCLOSURE OF THE PREFERRED EMBODIMENT

Figure 1:
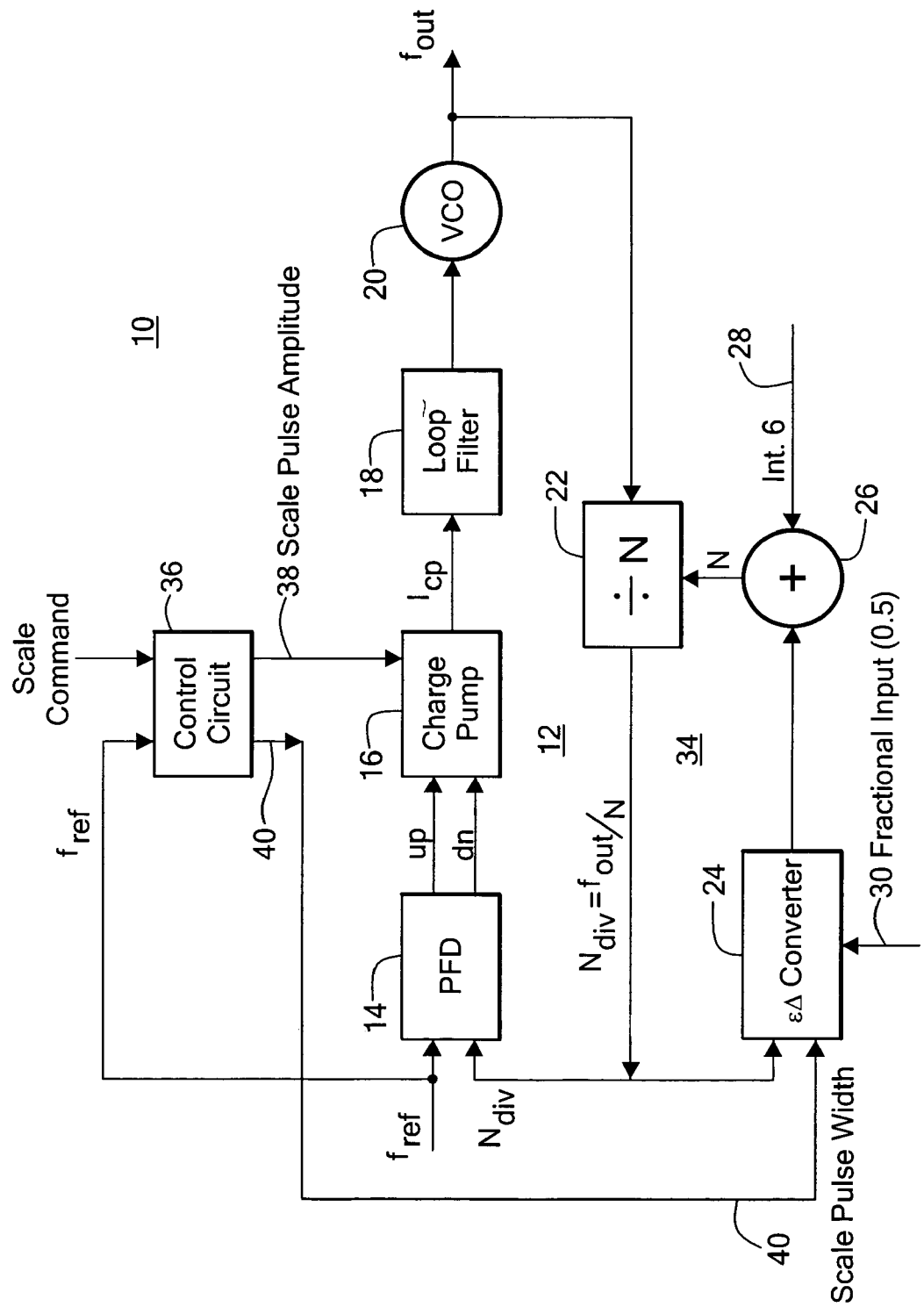
FIG. 1 is a schematic block diagram of a gain compensated fractional-N phase lock loop system according to this invention.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

There is shown in FIG. 1, a gain compensated fractional-N phase lock loop system 10 including phase lock loop 12. Phase lock loop 12 includes a phase/frequency detector 14, charge pump 16, loop filter 18, voltage controlled oscillator 20 and a divide by N circuit 22 in the feedback loop which divides the output frequency $f_{out}$ by a number N to obtain $N_{div}$ which is one input to the phase frequency detector 14. The other input is the $f_{ref}$ input.

In operation phase frequency detector 14 senses any difference between the $f_{ref}$ input and the $N_{div}$ input and provides a direction of either up or down to charge pump 16 which then provides either positive or negative current pulses, $I_{cp}$, to loop filter 18. The current pulses are converted by loop filter 18 to a voltage which is sufficient to shift the frequency of voltage controlled oscillator 20, $f_{out}$, so that after division by N divider circuit 22, $N_{div}$ will now just equal $f_{ref}$. In this particular phase lock loop 12, N is a fraction not an integer. In order to obtain the fractional value for N summer 26 receives an integer, for example, 6 on line 28 and combines it with an input from ΣΔ converter 24 to obtain the fractional value for N. For example, if the fractional value N is desired to be 6.5 and the integer supplied on line 28 as indicated is 6, then ΣΔ converter 24 is programmed by the fractional input of 0.5 on line 30 to produce a pattern of 1's and 0's to summing circuit 26 such that N is alternately equal to 7 and 6 in even measure so that the average turns out to be 6.5. For example, to obtain a division by 6.5, N would have a value of 6 on every other cycle and 7 on the intervening cycles. For a division of 6.75, N would have a value of 6 on one cycle followed by three cycles of 7 to obtain the average of 6.75.

Periodically it is required to decrease the amplitude of the current pulses, $I_{cp}$, being put out by charge pump 16 in order to narrow the bandwidth and reduce noise. This is usually done in a series of steps whereby the charge pump current amplitude is successively halved. This halves the charge supplied to loop filter 18, in that cycle, which results in only half the correction voltage being provided to VCO 20. With only half the correction voltage VCO 20 only corrects partway for the difference between $f_{ref}$ and $N_{div}$ at the input of phase frequency detector 14. Therefore phase lock loop 12 is out of lock and requires a number of cycles to pull back into lock once more; phase lock loop 12 is a relatively slow acting analog loop.

In accordance with this invention, however, phase lock loop 12 is "tricked" using the much faster acting digital loop 34 that includes the ΣΔ converter 24. When control circuit 36 receives a scale command to reduce the charge pump pulse amplitude it uses $f_{ref}$ to produce two output pulses: a scale pulse amplitude on line 38 and a scale pulse width on line 40. The scale command can come from any source inside or outside of the system. The scale pulse width signals are actually developed one cycle before the scale pulse amplitude signals in anticipation of the reduction of the pulse amplitude in order to minimize the effect of the current reduction on PLL 12 as will be explained hereinafter with reference to FIGS. 5 and 6. The scale pulse amplitude on line 38 causes charge pump 16 to put out charge pulses which are at, for example, half the normal amplitude. However, in accordance with this invention the scale pulse width command on line 40 causes ΣΔ converter 24 to, for example, double its output from one to two in the case where the charge pump current pulse amplitude has been halved thereby doubling the output from ΣΔ converter 24 to summing circuit 26. This increases N from integer 6 to 8 instead of 7. This shifts the rising edge of $N_{div}$ and since the width of the charge pump pulses is determined by the difference between the rising edge of $f_{ref}$ and the rising edge of $N_{div}$ the charge pump current pulse width has been effectively doubled substantially offsetting the halving of the charge pump current caused by the pulse amplitude halving.

Figure 2:
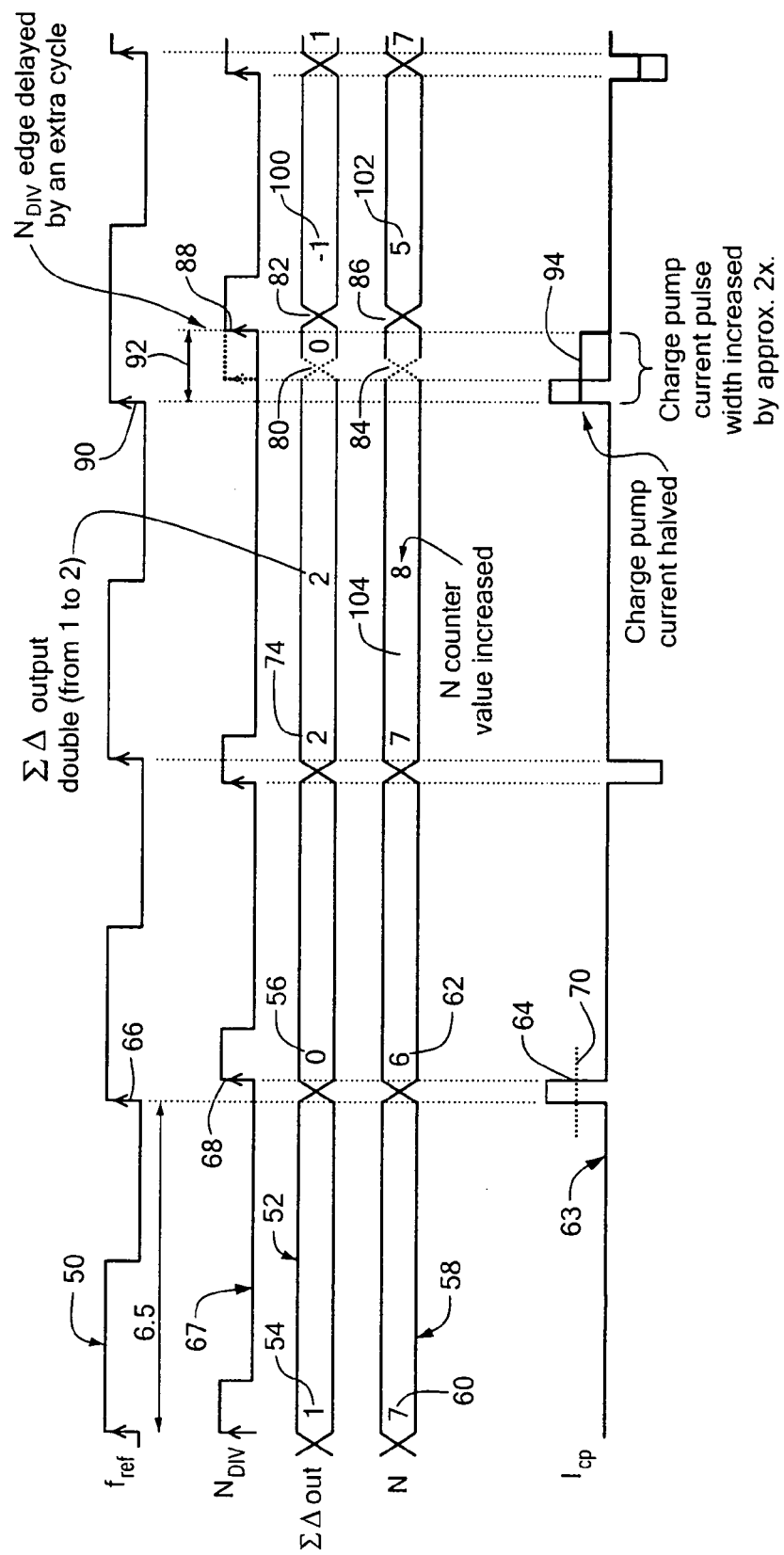
FIG. 2 shows waveforms illustrating operation of the gain compensated fractional-N phase lock loop system of FIG. 1.

This can be better understood with reference to FIG. 2, where $f_{ref}$ 50 is shown having a nominal period of 6.5. ΣΔ converter 24 provides an output 52 which is for alternate periods one, 54 and zero, 56. The one added to the integer six gives a value of N, 58, of seven, 60, for that same period. The following period where the ΣΔ output is zero, 56, the value then becomes six as at 62. This continues to alternate in this way so that the average is 6.5. The charge pump current $I_{cp}$ 63 includes charge pulses 64 whose width is determined by the difference between the rising edge 66 of $f_{ref}$ and the rising edge 68 of $N_{div}$ 67.

When the amplitude of charge pump current pulse 64, for example, is halved as shown by dashed line 70, the amount of charge it contains will be only half of that expected. To compensate for this, the scale pulse width command on line 40 is delivered to ΣΔ converter 24 and causes it to double its output by adding two, 74. This drives the value of N up two units to 8 instead of 7. This moves the expected transition of ΣΔ output 52 from 80 to 82 which increases the value of N so that the value of N, 58, moves from seven at 84 to eight at 86. This shifts the rising edge 88 of the corresponding $N_{div}$ pulse with respect to the rising edge 90 of $f_{ref}$ 50 so that now the distance between the two shown at 92 has effectively doubled and substantially doubled the width of the charge pump pulse 94. Thus while the amplitude of the charge pump current pulse has been halved its width has been substantially doubled so that the amount of charge has remained approximately the same. And this has been done extremely fast by the fast operating digital loop 34 before the slow operating analog phase lock loop 12 can be disturbed by the halving of the current amplitude. The ΣΔ converter 24 adjusts within one or two clock cycles whereas the PLL 12 would require hundreds of clock cycles, e.g. tens of microseconds.

ΣΔ converter 24 inherently acts so that over time it maintains its average output as commanded by the fractional input e.g. 0.5 on input 30. So now it acts to respond to the larger, 8, output. On the next cycle ΣΔ converter 24 outputs a −1 which when added (6+−1 is 5), in period 100 of converter output 52 results in an N=5 during that period 102 of the N output 58. The 5 value for period 102 added to the 8 value for the previous period 104 is 13 which divided by 2 is 6.5 and so the average N of 6.5 is maintained through the loop while the charge has been kept the same in order to prevent PLL 12 from seeing the potential disturbance.

In this particular example the pulse amplitude has been halved while the pulse width is doubled, this is not a necessary limitation of the invention. Regardless of by what factor the amplitude is reduced, the pulse width will be increased by the inverse of that factor and the reverse is applicable as well. That is, the pulse amplitude can be increased by a predetermined factor while the pulse width is decreased by that same factor. In that case the multiplier would be replaced by a circuit that reduces or divides the integrator contents or the multipliers would simply multiply by a number less than one i.e. a fraction. In either case the scaling is accomplished in this invention in the ΣΔ converter 24 by scaling the output of the one integrator in a ΣΔ converter or the one or more of the plurality of integrators in a ΣΔ converter. ΣΔ converter 24 is pictured in FIG. 3 as a third order ΣΔ converter, therefore it has three integrators 110, 112, and 114. The three integrators 110, 112, and 114 are connected in series to amplifier 116, to summing circuit 118 and then to quantizer 120. There are a number of feed forward paths 122, 124, 126 and 128 to overcome the inherent phase shift and a feedback path using amplifier 130 is provided in a conventional fashion.

Figure 3:
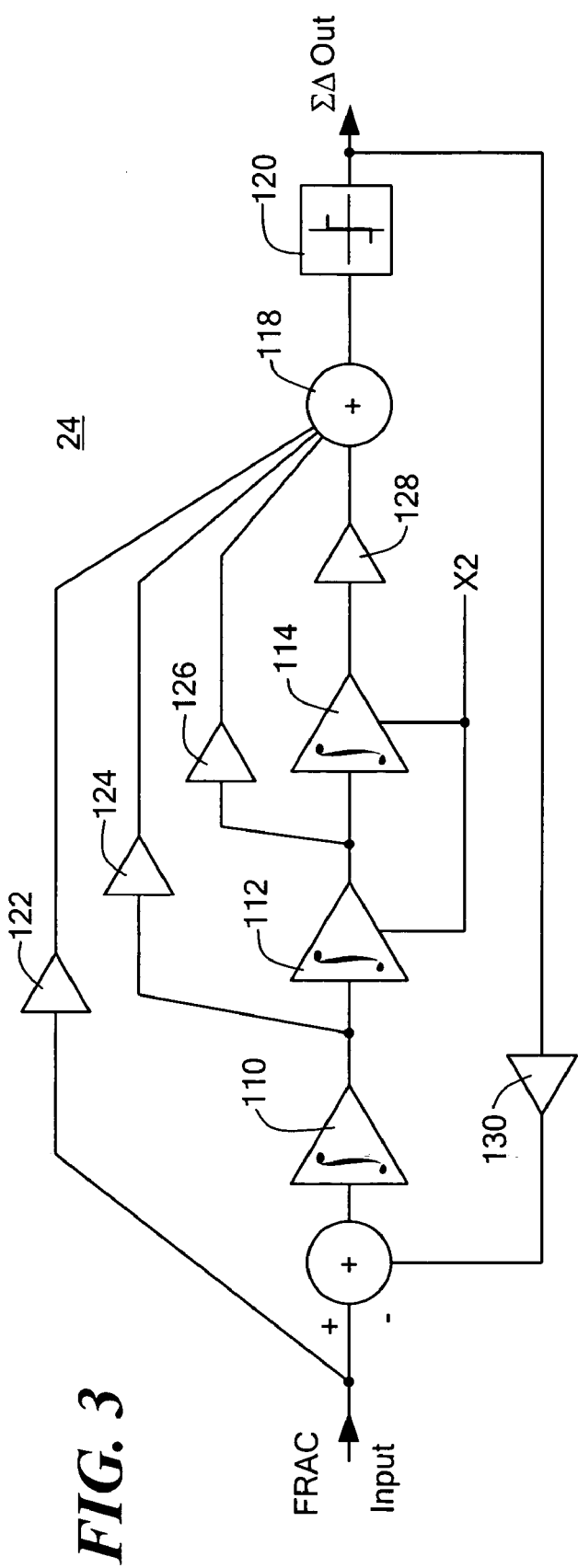
FIG. 3 is a more detailed schematic diagram of the ΣΔ converter of FIG. 1.
Figure 4:
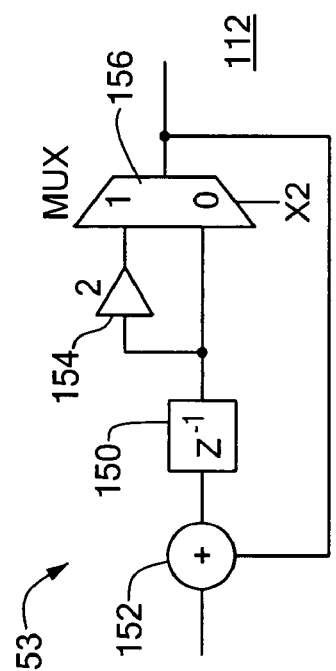
FIG. 4 is a more detailed schematic diagram of an integrator of FIG. 3.

In this particular embodiment where the scaling factor is two, that is, the charge pump current pulse amplitude is halved by two and the pulse width is increased by two or doubled, the contents or output of one or more of the integrators 112, 114 is caused to be doubled by the input signal X2. If this were a first order ΣΔ converter, there would be but one integrator 110 and it would be designed to receive the X2 scaling input. With an order of two or more, for example three, as shown in FIG. 3, typically the first integrator in the succession is not scaled but one or more of the others are. The scaling is done by adding to each integrator, which includes a delay 150, FIG. 4, and summing circuit 152, a scaling circuit 153 which includes a doubling circuit or more generically a multiplier circuit 154 and a switching circuit such as mux 156. The signal X2 operates mux 156 to select either the direct output from delay 150 or the multiplied or doubled output from multiplier 154. Note that if the scaling was a scaling down instead of up, the multiplier 154 would be a divider. Note further that the multiplier or divider 154 is not restricted to being at the output of delay 150: it may be at the input or anywhere where it can effectively multiply/divide the contents. Note also that multiplier circuit may multiply by a number greater than one to scale up or multiply by a number less than one, a fraction, to divide or scale down.

Figure 5:
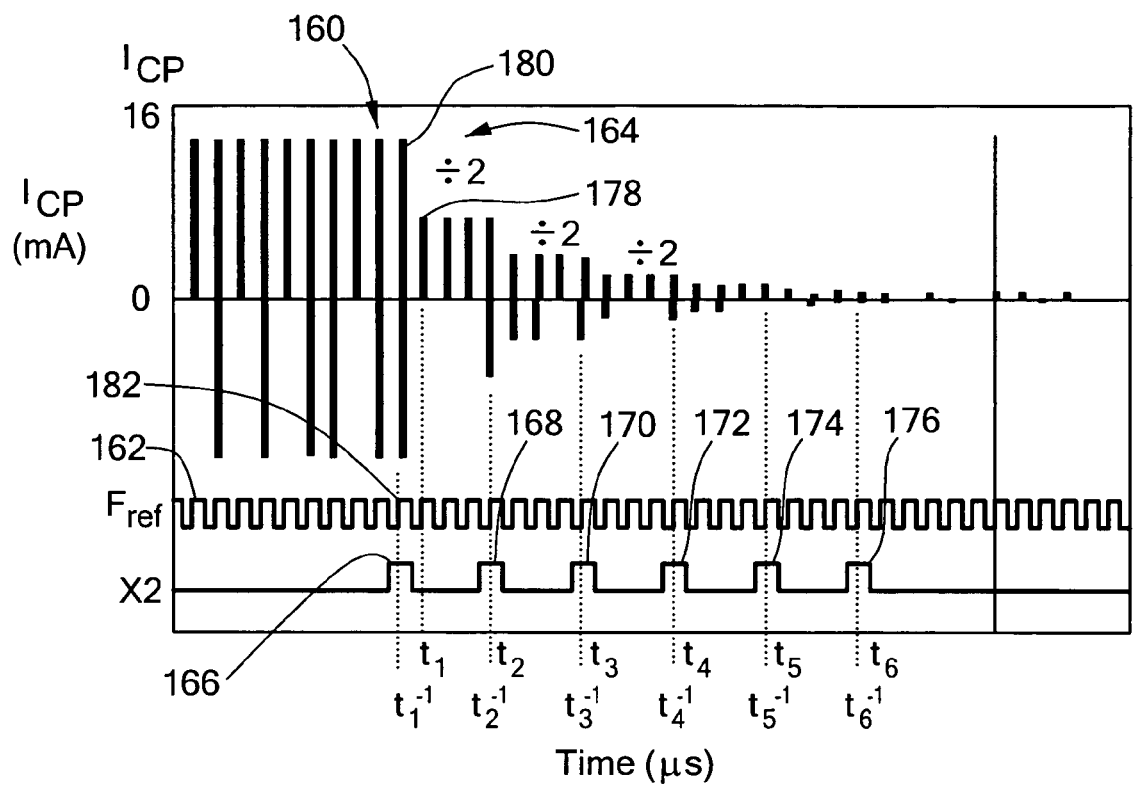
FIG. 5 shows waveforms illustrating the generation of the scaling command.

The X2 signal is developed from the charge pump current pulses 160, FIG. 5, and $f_{ref}$ 162. Each time the amplitude 164 of the current pulses 160 is halved for example, an X2 pulse 166 is developed. In this particular case the current amplitude is stepped down in six steps by halving it and the X2 scaling command pulses 166, 168, 170, 172, 174, and 176 are generated one $f_{ref}$ cycle before the halving of the amplitude occurs. Thus since the amplitude will be halved at charge pump pulse 178 there will be developed at charge pump pulse 180 in conjunction with $f_{ref}$ pulse 182 the X2 scale command pulse 166 at time $t_1$−1. The first charge pump of halved amplitude 178 occurs one cycle of $f_{ref}$ later at $t_1$. So too with the remaining half steps: pulses 168, 170, 172, 174, 176 are developed at times $t_2$−1, $t_3$−1, $t_4$−1, $t_5$−1, and $t_6$−1 which are each one cycle before the respective drop in amplitudes at $t_2$ $t_3$, $t_4$, $t_5$, and $t_6$.

Figure 6:
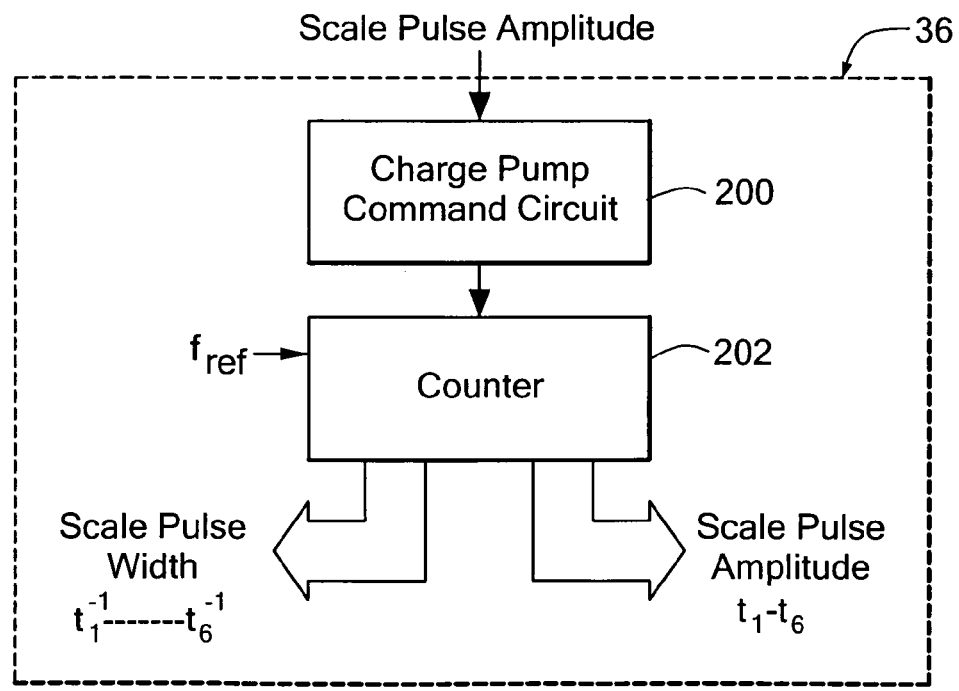
FIG. 6 is a more detailed schematic block diagram of the control circuit of FIG. 1 enabled by the waveforms of FIG. 5.

Control circuit 36, FIG. 6, accomplishes this using a charge pump command circuit 200 and counter 202. Command circuit 200 is a logic circuit which develops the $t_x$ and $t_x$−1 signals in conjunction with $f_{ref}$. Upon the receipt of a signal to scale up the pulse amplitude, charge pump command 200 enables counter 202 responding to the $f_{ref}$ input to develop the scaled pulse width signals X2 at $t_2$−1, $t_3$−1, $t_4$−1, $t_5$−1, and $t_6$−1 to drive the integrators 112 and 114, FIG. 3, and also provides the scale pulse amplitude signals $t_1$−$t_6$ to scale down the amplitude of the charge pump current pulses.

Figure 7:
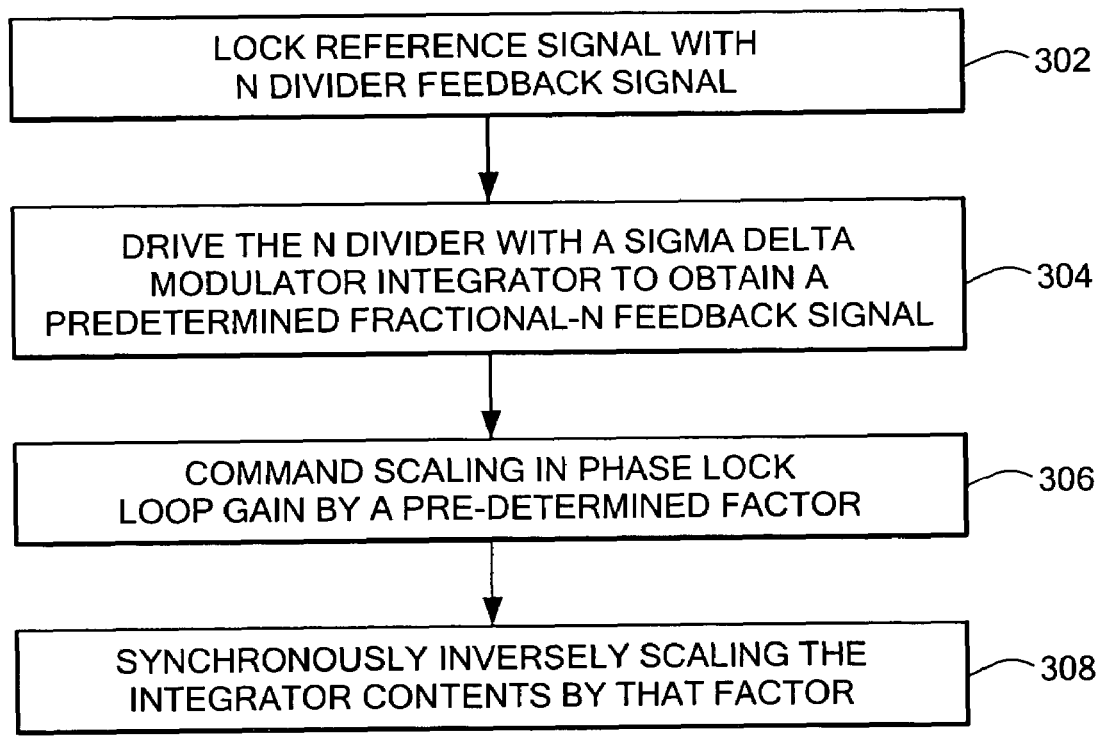
FIG. 7 is a schematic block diagram of the method of this invention.

The gain compensation method 300, FIG. 7, for a fractional-N phase lock loop according to this invention is not restricted to the implementation shown herein or any particular implementation. It involves the technique of locking a reference signal 302 with the N divider feedback signal in a phase lock loop including a phase detector, charge pump, loop filter and voltage control oscillator with an N divider in its feedback loop and driving the N divider with a sigma delta modulator including at least one integrator to obtain a predetermined fractional-N feedback signal 304. A scaling in phase lock loop gain by a predetermined factor is commanded 306 and synchronously inversely the contents of at least one of said integrators is scaled by the factor 308. The scaling by the predetermined factor may be of the charge pump current pulse amplitude, for example, in order to scale the width of said charge pump pulses to maintain the expected charge from the charge pump.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims. In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

What is claimed is:

1. A gain compensated fractional-N phase lock loop system comprising:
   a phase lock loop including a phase detector, charge pump, loop filter and voltage control oscillator with an N divider in its feedback loop for locking a reference signal with the N divider feedback signal;

a sigma delta modulator including at least one integrator for driving said N divider to obtain a predetermined fractional-N feedback signal;

a control circuit for commanding a scaling in phase lock loop gain by a predetermined factor and synchronously inversely scaling by said factor the contents of said at least one integrator.

2. The gain compensated fractional-N phase lock loop system of claim 1 in which said control circuit commands a scaling in charge pump current pulse amplitude by a predetermined factor and synchronously inversely scales by said factor the contents of said at least one integrator to scale the width of said charge pump pulses to maintain the expected charge from the charge pump.

3. The gain compensated fractional-N phase lock loop system of claim 2 in which said at least one integrator includes a scaling circuit for scaling the contents of its associated integrator.

4. The gain compensated fractional-N phase lock loop system of claim 3 in which said scaling circuit includes a multiplier circuit for scaling the integrator contents and a switching circuit for selecting the contents of the integrator or the scaled contents of the integrator to effect the scaling factor.

5. The gain compensated fractional-N phase lock loop system of claim 4 in which said control circuit includes a counter responsive to the reference signal and commanded charge pump current pulse amplitude scaling.

6. The gain compensated fractional-N phase lock loop system of claim 5 in which said counter enables said switching circuit to select the contents of said at least one integrator one cycle before the scaling of the charge pump current pulse amplitude.

7. The gain compensated fractional-N phase lock loop system of claim 1 in which there are a plurality of successive integrators and at least one beyond the first integrator has a scaling circuit for scaling the contents of its associated integrator.

8. The gain compensated fractional-N phase lock loop system of claim 2 in which the scaling factor applied to the charge pump current pulse amplitude is a decrease and the inverse applied to said at least one integrator is an increase.

9. The gain compensated fractional-N phase lock loop system of claim 1 in which the predetermined factor is greater than one.

10. The gain compensated fractional-N phase lock loop system of claim 1 in which the scaling factor is less than one.

11. A gain compensated fractional-N phase lock loop system comprising:

a phase lock loop including a phase detector, charge pump, loop filter and voltage control oscillator with an N divider in its feedback loop for locking a reference signal with the N divider feedback signal;

a sigma delta modulator including at least one integrator for driving said N divider to obtain a predetermined fractional-N feedback signal;

a control circuit for commanding a scaling in charge pump current pulse amplitude by a predetermined factor and synchronously inversely scaling by said factor the contents of said at least one integrator to scale the width of said charge pump pulses to maintain the expected charge from the charge pump: said at least one integrator including a scaling circuit for scaling the contents of its associated integrator, said scaling circuit including a multiplier circuit for scaling said at least one integrator contents and a switching circuit for selecting the contents of the integrator or the scaled contents of said at least one integrator to effect the scaling factor; said control circuit further including a counter responsive to the reference signal and commanded charge pump current pulse amplitude scaling for enabling said switching circuit to select the contents of said at least one integrator one cycle before the scaling of the charge pump current pulse amplitude.

12. A gain compensation method for a fractional-N phase lock loop comprising:

locking a reference signal with the N divider feedback signal in a phase lock loop including a phase detector, charge pump, loop filter and voltage control oscillator with an N divider in its feedback loop;

driving said N divider with a sigma delta modulator including at least one integrator to obtain a predetermined fractional-N feedback signal; and commanding a scaling in phase lock loop gain by a predetermined factor and synchronously inversely scaling by said factor the contents of said at least one integrator.

13. A gain compensation method for a fractional-N phase lock loop comprising:

locking a reference signal with the N divider feedback signal in a phase lock loop including a phase detector, charge pump, loop filter and voltage control oscillator with an N divider in its feedback loop;

driving said N divider with a sigma delta modulator including at least one integrator to obtain a predetermined fractional-N feedback signal; and commanding a scaling in charge pump current pulse amplitude by a predetermined factor and synchronously inversely scaling by said factor the contents of at least one of said integrators to scale the width of said charge pump pulses to maintain the expected charge from the charge pump.

* * * * *